United States Patent
Hur

[19]

[11] Patent Number: 5,863,619
[45] Date of Patent: Jan. 26, 1999

[54] METHOD OF AND APPARATUS FOR COATING PHOTORESIST FILM

[75] Inventor: Ik Boum Hur, Kyoungki-do, Rep. of Korea

[73] Assignee: Hyundai Electronics Industries Co., Ltd., Ichon-shi, Rep. of Korea

[21] Appl. No.: 574,139

[22] Filed: Dec. 18, 1995

[30] Foreign Application Priority Data

Dec. 22, 1994 [KR] Rep. of Korea .................. 94-35898

[51] Int. Cl.$^6$ .............................. B05D 5/025; B05D 7/24
[52] U.S. Cl. .......................... 427/483; 427/485; 427/562
[58] Field of Search .................................. 427/459, 460, 427/461, 485, 525, 562, 563, 564, 561, 447, 421, 452, 565

[56] References Cited

U.S. PATENT DOCUMENTS

| | | | |
|---|---|---|---|
| 2,967,331 | 1/1961 | Kaspar | 427/485 |
| 4,114,564 | 9/1978 | Probst | 427/480 |
| 4,170,074 | 10/1979 | Hickman et al. | 427/459 |
| 4,433,003 | 2/1984 | Gourdine | 427/485 |
| 5,229,171 | 7/1993 | Donovan et al. | 427/485 |
| 5,340,604 | 8/1994 | Atsushi | 427/561 |
| 5,399,388 | 3/1995 | Aklufi | 427/565 |
| 5,520,715 | 5/1996 | Oeftering | 427/565 |
| 5,560,962 | 10/1996 | Brunger et al. | 427/475 |

OTHER PUBLICATIONS

Dictionary excerpts. (1) *Webster's 9th New Colligiate*Dic.; Merrian–Webster Inc., Springfield, Mass.; 1990 (no month) p. 1309.

(2) *Hackh's Chemical Dic.*3rd ed; Grant, ed., McGraw–Hill Book Co., 1944 (no month). p. 893.

*Primary Examiner*—Marianne Padgett
*Attorney, Agent, or Firm*—Thelen Reid & Priest LLP

[57] ABSTRACT

A method of and an apparatus for coating a photoresist film over a wafer, capable of eliminating local non-uniformity of the photoresist film and uniformly controlling the thickness of the photoresist film. The method includes the steps of vaporizing and injecting a liquid photoresist material to form photoresist particles, electrically charging photoresist particles, establishing an electric field in an area where the photoresist particles flow, thereby deflecting the photoresist particles, and selectively taking the photoresist particles passing through a desired zone, and depositing the selected photoresist particles over the wafer. The apparatus includes a Venturi tube for pumping up a liquid photoresist material and injecting the pumped photoresist material in a vapor phase, a first insulating tube adapted to disperse the photoresist particles formed upon injecting the liquid photoresist material, electrodes coupled to a voltage source and adapted to deflect the flow direction of the photoresist particles, a second insulating tube adapted to pass the photoresist particles deflected by the electrode therethrough, and a third insulating tube adapted to take only a portion of the photoresist particles emerging from the second insulating tube.

3 Claims, 1 Drawing Sheet

METHOD OF AND APPARATUS FOR COATING PHOTORESIST FILM

BACKGROUND OF THE INVENTION

1. Field of the Invention

The present invention relates to a method of and an apparatus for coating a photoresist film over a wafer in the lithography process for the fabrication of semiconductor devices, and more particularly to a method of and an apparatus for coating a photoresist film over a wafer, capable of eliminating local non-uniformity of the photoresist film possibly caused by the topology of the wafer and uniformly controlling the thickness of the photoresist film.

2. Description of the Prior Art

In the lithography process for the fabrication of semiconductor devices, generally, the formation of a photoresist film over a wafer is involved. The formation of such a photoresist film is carried out by coating a photoresist material, which consists of photoresist particles dissolved in a solvent, over a wafer while rotating the wafer by use of a nozzle.

However, this injection method has a problem that the thickness of the photoresist film coated on the wafer is locally non-uniform when the photoresist material contains photoresist particles of wide grain size ranges. Although the photoresist particles of a small grain size have little effect on the uniformity of the coated photoresist film, those of a larger grain size have a considerable effect on the uniformity of the photoresist film, thereby making it impossible to form a uniform pattern.

SUMMARY OF THE INVENTION

Therefore, an object of the invention is to provide a method of and an apparatus for coating a photoresist film over a wafer, capable of eliminating non-uniformity of the photoresist film caused by the topology of the wafer, thereby achieving an improvement in the process redundancy and process yield.

In accordance with one aspect, the present invention provides a method for coating a photoresist film over a wafer, comprising the steps of: vaporizing and injecting a liquid photoresist material to form photoresist particles; electrically charging photoresist particles; establishing an electric field in an area where the photoresist particles flow, thereby deflecting the photoresist particles; and selectively taking the photoresist particles passing through a predetermined zone, and depositing the selected photoresist particles over the wafer.

In accordance with another aspect, the present invention provides an apparatus for coating a photoresist film over a wafer, comprising: a Venturi tube for pumping up a liquid photoresist material in a tank disposed below the Venturi tube and injecting the pumped photoresist material in a vapor phase; a first insulating tube connected to the Venturi tube, the first insulating tube serving to disperse photoresist particles formed upon injecting the liquid photoresist material; at least one electrode coupled to a voltage source, the electrode serving to deflect the flow direction of the photoresist particles emerging from the first insulating tube; a second insulating tube connected to the first insulating tube, the second insulating tube passing the photoresist particles deflected by the electrode therethrough; and a third insulating tube connected to the second insulating tube, the third insulating tube taking only a portion of the photoresist particles emerging from the second insulating tube.

BRIEF DESCRIPTION OF THE DRAWINGS

Other objects and aspects of the invention will become apparent from the following description of embodiments with reference to the accompanying drawing in which.

DETAILED DESCRIPTION OF THE PREFERRED EMBODIMENTS

Figure 1:
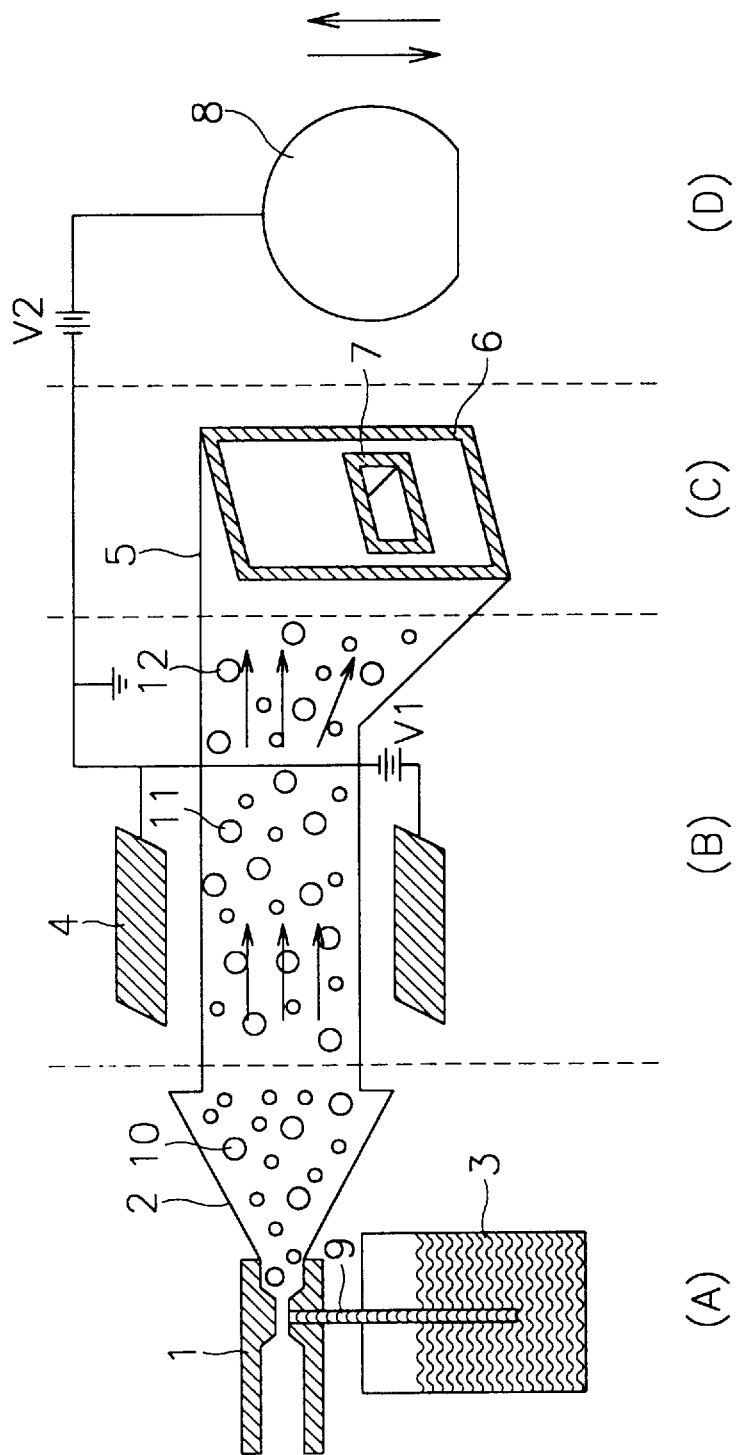
FIG. 1 is a schematic view illustrating a photoresist coating apparatus according to the present invention.

FIG. 1 illustrates a photoresist coating apparatus according to the present invention.

As shown in FIG. 1, the photoresist coating apparatus includes a Venturi tube 1 connected to a fine tube which is disposed beneath the Venturi tube 1. The venturi tube 1 pumps up a liquid photoresist material from a tank through the fine tube 9 and then injects the pumped liquid photoresist material in a vapor phase. The photoresist material consists of photoresist particles dissolved in a solvent. The photoresist coating apparatus also includes a first insulating tube 2 disposed downstream the Venturi tube 1, and a second insulating tube 5 disposed downstream the first insulating tube 2. The first insulating tube 2 serves to pass photoresist particles 10 injected out of the Venturi tube 1 therethrough. The first insulating tube 2 has a taper construction increasing in the cross-sectional area toward its downstream end. Electrodes 4 are disposed around a portion of the second insulating tube 5 disposed toward the first insulating tube 2. The electrodes 4 are coupled to a voltage source V1, thereby serving to deflect the flow direction of the photoresist particles 10 passing through the first insulating tube 2. The second insulating tube 5 has an enlarged portion disposed downstream of the electrodes 4. While passing through the second insulating tube 5, an electric field established by the electrodes 4 is applied to the photoresist particles. At the downstream end of the second insulating tube 5, a third insulating tube 7 is arranged which serves to allow only the photoresist particles, existing in a desired zone of the second insulating tube 5, to pass therethrough.

Through the Venturi tube 1 shown in section A of FIG. 1, gas of high pressure flows. At the smaller-diameter portion of the Venturi tube 1 where the fine tube 9 is connected, the gas flow has a high flow rate, whereby its pressure decreases. Accordingly, the photoresist material 3 (in a liquid phase dissolved in the solvent) in the tank disposed beneath the Venturi tube 1 is pumped up to the Venturi tube 1 through the fine tube 9. The photoresist material entering the Venturi tube 1 is then struck by the gas flowing at a high velocity in the Venturi tube 1. As a result, the photoresist material 3 is changed into a particle phase while emerging from the Venturi tube 1. The photoresist particles 10 then pass through the first insulating tube 2.

Preferably, the gas flowing through the Venturi tube 1 has the same composition as the solvent of the photoresist material 3. In this case, it is possible to prevent a phenomenon that the photoresist particles are not sufficiently deposited on a wafer by the solidification of them after the evaporation of the solvent or a phenomenon that voids are formed in the final photoresist film. Therefore, a thickness uniformity of the photoresist film can be obtained.

On the other hand, the photoresist particles emerging from the Venturi tube 1 are dispersed by the diffusion function of the first insulating tube 2 because the first insulating tube 2 has the taper construction increasing in cross-sectional area toward its downstream end.

The photoresist particles injected out of the Venturi tube 1 have various grain sizes. These photoresist particles are denoted by the reference numeral 11 in section B of FIG. 1. In order to coat a photoresist film having a uniform thickness over the wafer, accordingly, only the photoresist particles having a desired grain size and a desired orientation are taken for the coating. To this end, the photoresist particles 11 are not only electrically charged, but also applied with an electric field in accordance with the present invention.

Charging the photoresist particles can be achieved by injecting pressurized gas of an ionized state onto the photoresist particles 10 just discharged from the Venturi tube 1 or by implanting ion atoms in the photoresist particles 10.

While passing through the second insulating tube 5, the electrically charged photoresist particles 11 are deflected by the electric field. The electric field is established by the electrodes 4 disposed above and beneath the second insulating tube 5. The deflection of each photoresist particle 11 is determined by the mass and charge of the photoresist particle. For example, particles having a large mass are deflected at a small angle whereas those having a smaller mass are deflected at a larger angle.

In section B of FIG. 1, the flow of photoresist particles 12 deflected after passing through the electric field are shown. These deflected photoresist particles 12 are introduced in the enlarged portion of the second insulating tube 5. The second insulating tube 5 has a maximum area 6 at its downstream end. By taking photoresist particles passing through a certain zone of the area 6, it is possible to select only those of a desired grain size. This will now be described in detail.

Generally, photoresist particles have a nearly spherical shape irrespective of the grain size because their viscosity is very high. The amount of charge borne in each photoresist particle is proportional to the surface area of the photoresist particle and the mass of the photoresist particle is proportional to the cube of the volume of the photoresist particle. In this regard, photoresist particles of a certain grain size range can be taken out by passing them through an electric field.

In accordance with the present invention, upon forming a photoresist film only the photoresist particles emerging from a desired zone of the second insulating tube 5, namely, passing through the third insulating tube 7 are deposited on a wafer, thereby improving the thickness uniformity of the photoresist film. During the deposition, the wafer 8, which is shown in section D of FIG. 1, is vertically and laterally moved to obtain a uniform photoresist thickness. The photoresist deposition rate can be adjusted by connecting an electrode exhibiting a polarity opposite to the charge borne in the photoresist particles and controlling voltage V2 applied to the electrode.

The grain size of photoresist particles to be coated over the wafer 8 is adjustable by adjusting both the position of the third insulating tube 7 corresponding to a portion of the downstream end of the second insulating tube 5 and the voltage V1 applied to the electrodes 4.

As apparent from the above description, the present invention provides a method of and an apparatus for coating a photoresist film over a wafer, wherein a photoresist material consisting of photoresist particles dissolved in a solvent is injected in a vapor phase by use of a venturi tube, thereby injecting photoresist particles which are, in turn, charged and deflected by an electric field established in an area where the photoresist particles flow. By the deflection of photoresist particles, it is possible to take those with a desired grain size range. By depositing the selected photoresist particles over a wafer, it is possible to eliminate non-uniformity of the photoresist film caused by different grain sizes of photoresist particles or the topology of the wafer. Therefore, the photoresist film can have a uniform thickness.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for coating a photoresist film on a wafer, comprising:

providing a liquid photoresist;

vaporizing the liquid photoresist so as to form photoresist particles that flow into an area;

electrically charging the photoresist particles;

establishing an electric field in the area in which the electrically-charged photoresist particles flow, so as to deflect the electrically-charged photoresist particles by differing respective amounts of deflection;

passing toward the wafer through a zone, only a subset of the electrically-charged photoresist particles that are deflected by the electric field through the zone;

depositing on the wafer, the electrically-charged photoresist particles that are deflected and pass through the zone, so as to coat the wafer with the photoresist film; and adjusting the zone to have a predetermined size and position so that only electrically-charged photoresist particles having a predetermined grain size pass through the zone to be deposited on the wafer.

2. The method of claim 1, wherein the vaporizing includes:

passing the liquid photoresist through a Venturi tube.

3. The method of claim 1, further comprising:

applying a voltage to the wafer to enhance a deposition rate of the electrically-charged photoresist particles on the wafer.

* * * * *